US009281684B2

(12) United States Patent
Clarke et al.

(10) Patent No.: US 9,281,684 B2
(45) Date of Patent: Mar. 8, 2016

(54) INTERCONNECT DEVICE FOR DETECTING WHETHER A VEHICLE ON-BOARD DIAGNOSTICS (OBD) DATA PORT INCLUDES CIRCUITRY WHICH PREVENTS BACK FEEDING OF POWER THROUGH THE OBD DATA PORT

(71) Applicant: Schumacher Electric Corportion, Mount Prospect, IL (US)

(72) Inventors: Patrick J. Clarke, St. Charles, IL (US); John S. Whiting, Hampshire, IL (US); John B. Borke, Crystal Lake, IL (US); Matthew Adam Heins, Arlington Heights, IL (US); Samuel I. Weisbard, Highland Park, IL (US)

(73) Assignee: Schumacher Electric Corporation, Mt. Prospect, IL (US)

( * ) Notice: Subject to any disclaimer, the term of this patent is extended or adjusted under 35 U.S.C. 154(b) by 220 days.

(21) Appl. No.: 13/799,506

(22) Filed: Mar. 13, 2013

(65) Prior Publication Data
US 2014/0265592 A1 Sep. 18, 2014

(51) Int. Cl.
 H02J 1/10 (2006.01)
 H02J 1/06 (2006.01)
 G06Q 30/02 (2012.01)
 H02J 1/08 (2006.01)
 H02J 1/00 (2006.01)
 G01R 31/00 (2006.01)

(52) U.S. Cl.
 CPC ............... *H02J 1/06* (2013.01); *G01R 31/007* (2013.01); *G06Q 30/02* (2013.01); *G07C 2205/02* (2013.01); *H02J 1/08* (2013.01); *H02J 1/10* (2013.01); *H02J 2001/006* (2013.01); *Y10T 307/625* (2015.04)

(58) Field of Classification Search
 CPC ..................................................... G06Q 30/02
 See application file for complete search history.

(56) References Cited

U.S. PATENT DOCUMENTS

| 5,592,093 | A | 1/1997 | Klingbiel |
| 6,344,748 | B1 | 2/2002 | Gannon |
| 2006/0238033 | A1 | 10/2006 | Raiser et al. |
| 2007/0135981 | A1 | 6/2007 | Raichle et al. |
| 2007/0198147 | A1 | 8/2007 | Keith et al. |

OTHER PUBLICATIONS

International Search Report for PCT Application No. PCT/US2014/025495 with a mailing date of Aug. 7, 2014.

*Primary Examiner* — Rexford Barnie
*Assistant Examiner* — Terrence Willoughby
(74) *Attorney, Agent, or Firm* — Michael Stanley Tomsa; McAndrews, Held & Malloy, Ltd.

(57) ABSTRACT

An interconnect device is disclosed for detecting whether an vehicle on-board diagnostics (OBD) data port includes a blocking diode or equivalent. that prevents back feeding of power through the OBD data port. If a diode is detected, the interconnect device alerts the user that the power cannot be back fed through the OBD II port connector. In such a condition, an alternate means is used to preserve the data mentioned above. Specifically, an alternative power supply can be connected directly to the battery cables that will be disconnected from the battery, for example, by way of battery clamps. In this way the alternative power supply is used to preserve the data until a new battery is reconnected to the vehicle battery cables. If a diode is not detected by the interconnect device, the interconnect device displays this fact to the user. The interconnect device includes circuitry for detecting and displaying whether a diode is connected in series with a power pin of the OBD II port connector. In addition, the interconnect device includes an OBD II port connector on one end connected by way of a cable to a connector, such as a cigarette lighter connector or hardwired directly to an alternate power supply.

24 Claims, 5 Drawing Sheets

INTERCONNECT DEVICE FOR DETECTING WHETHER A VEHICLE ON-BOARD DIAGNOSTICS (OBD) DATA PORT INCLUDES CIRCUITRY WHICH PREVENTS BACK FEEDING OF POWER THROUGH THE OBD DATA PORT

BACKGROUND OF THE INVENTION

1. Field of the Invention

The present invention relates to an interconnect device for detecting whether an vehicle on-board diagnostics (OBD) data port includes circuitry or other means that prevents back feeding of power through the OBD data port.

2. Description of the Prior Art

An on-board diagnostics (OBD) data port is mandated by the US government to be supplied on every car sold in the US since 1996. Other countries have similar standards. For example Europe has EOBD and EOBD2 standards while Japan has a JOBD standard. In the US, the OBD and the OBD data port was originally intended by the Environmental Protection Agency and the California Air Resources Board (CARB) to provide a convenient way to monitor whether the vehicle was running efficiently and cleanly.

The OBD II standard in the US requires that an OBD II data port be located within two feet of the steering wheel. The data port is specified as a 16 pin connector. Since 2008, the signals associated with each of the 16 pins are standardized.

During normal operation, the OBD diagnostic system monitor's various Parameter ID codes (PID). These PID codes relate to the status of the vehicle emissions. These PID codes can be read by connecting a OBD diagnostic tool to the OBD II data port to allow reporting of various of the vehicle systems. In addition to the PID codes mentioned above, various manufacturers include their own PIDs for monitoring other aspects of the vehicle performance that do not directly relate to emissions, for example, the transmission and tire pressure monitoring systems.

The OBD II connectors are also known to be used to preserve certain data that is stored on board the vehicle. This data includes consumer preference data, such as preferred mirror and seat positions, radio stations, GPS preference data and the vehicle clock. Such data is normally lost when the battery is disconnected from the vehicle, creating an inconvenience for the consumer to reprogram the data. In extreme cases, a loss of certain engine data may prevent the vehicle from being restarted.

Various vehicle memory saver devices are known which can supply power to the vehicle on-board computer systems to prevent data loss when the vehicle battery is disconnected. One such device is available from Schumacher Electric Company. The device includes an OBD II connector connected by a cable to a conventional cigarette lighter connector. The OBD II connector is connected to the OBD II data port of the vehicle in which the battery will be disconnected and the cigarette lighter connector is connected to another vehicle or alternate power source.

Unfortunately, some vehicle OBD II data ports include a circuitry or other means in series with the battery connection that prevents back feeding of DC power to the vehicle on-board computer systems. Since there is no convenient way of detecting whether the OBD II includes such circuitry or other means, known devices for back feeding power to the vehicle by way of the OBD II connector are unreliable. If a conventional device for back feeding power to through the OBD II port connector, the power will be blocked by the diode and the data mentioned above will be lost. The user will have no way of knowing this before the battery is disconnected. Thus, there is a need for detecting whether a vehicle OBD II connector includes such circuitry or other means.

SUMMARY OF THE INVENTION

Briefly, the present invention relates to an interconnect device for detecting whether an vehicle on-board diagnostics (OBD) data port includes circuitry or other means, which acts like a blocking diode or equivalent (hereinafter "diode" or "blocking diode") that prevents back feeding of power through the OBD data port. If a diode is detected, the interconnect device alerts the user that the power cannot be back fed through the OBD II port connector. In such a condition, an alternate means is used to preserve the data mentioned above. Specifically, an alternative power supply can be connected directly to the battery cables that will be disconnected from the battery, for example, by way of battery clamps. In this way the alternative power supply is used to preserve the data until a new battery is reconnected to the vehicle battery cables. If a diode is not detected by the interconnect device, the interconnect device displays this fact to the user. The interconnect device includes circuitry for detecting and displaying whether a diode is connected in series with a power pin of the OBD II port connector. In addition, the interconnect device includes an OBD II port connector on one end connected by way of a cable to a connector, such as a cigarette lighter connector or hardwired directly to an alternate power supply.

DESCRIPTION OF THE DRAWING

These and other advantages of the present invention will be readily understood with reference to the following specification and attached drawing wherein.

DETAILED DESCRIPTION

The present invention relates to an interconnect device for detecting whether an vehicle on-board diagnostics (OBD) data port includes a diode that prevents back feeding of power through the OBD data port. If a diode is detected, the interconnect device alerts the user that the power cannot be back fed through the OBD II port connector. In such a condition, an alternate means is used to preserve the data mentioned above. Specifically, an alternative power supply can be connected directly to the battery cables that will be disconnected from the battery, for example, by way of battery clamps. In this way the alternative power supply is used to preserve the data until a new battery is reconnected to the vehicle battery cables. If a diode is not detected by the interconnect device, the interconnect device displays this fact to the user. The interconnect device includes circuitry for detecting and displaying whether a diode is connected in series with a power pin of the OBD II port connector. In addition, the interconnect device includes an OBD II port connector on one end connected by way of a cable to a connector, such as a cigarette lighter connector or hardwired directly to an alternate power supply.

The interconnect device in accordance with the present invention provides the following attributes:

A way of indicating to the user that all connections between the interconnect device and the vehicle under service and the alternate power source are sound.

Measures the voltage of the alternate power source to be sure it is at or above required nominal input levels to serve as a temporary replacement for the vehicles battery before allowing connection through the OBD port.

Detect whether an OBD II port connector includes a diode connected in series to the power pin and indicate visually to the user that the vehicle data will not be preserved using a device connected to the OBD II data port connector if the diode is present.

Provide the user a positive visual indication that it is OK to service and or remove the vehicle battery without the possible loss of vehicle data by way of an alternate power supply connected to the OBD II port connector.

Figure 1:
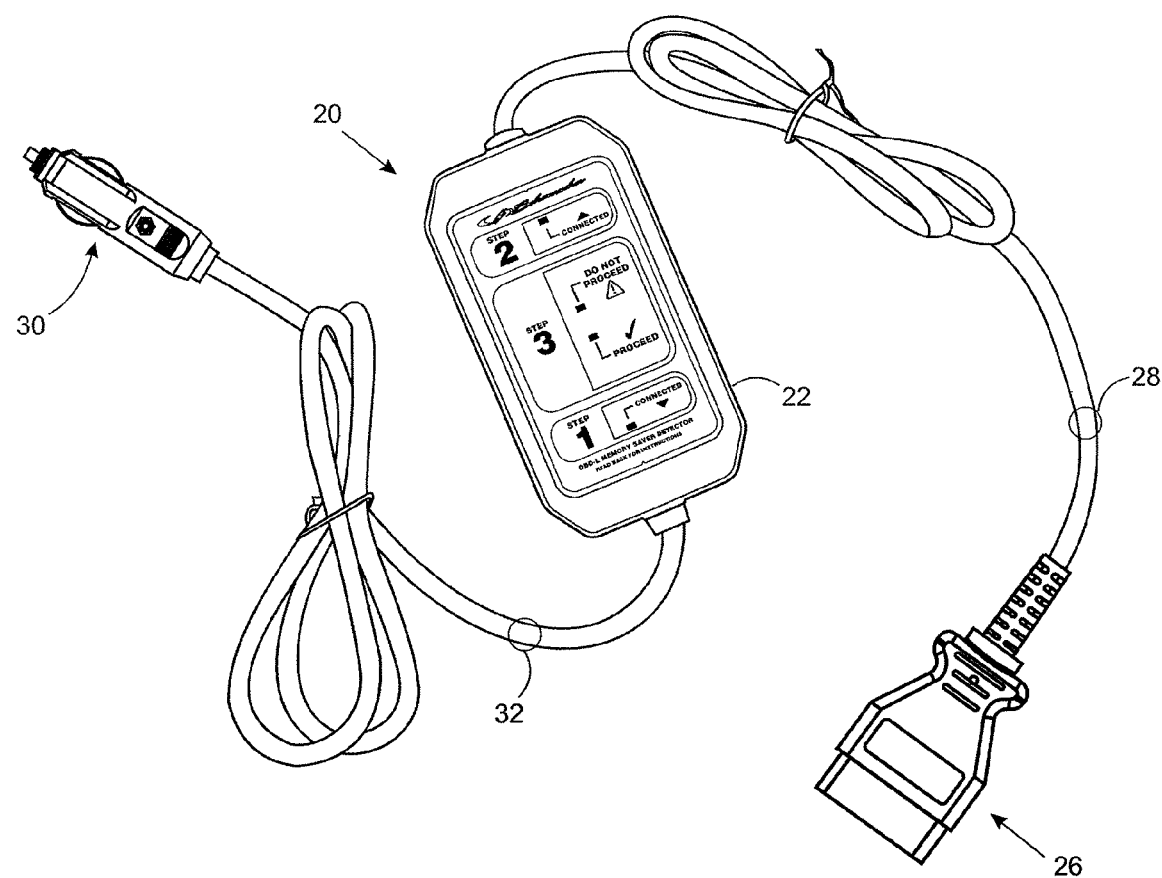
FIG. 1 is a front elevational view of the interconnect device in accordance with the present invention.
Figure 5:
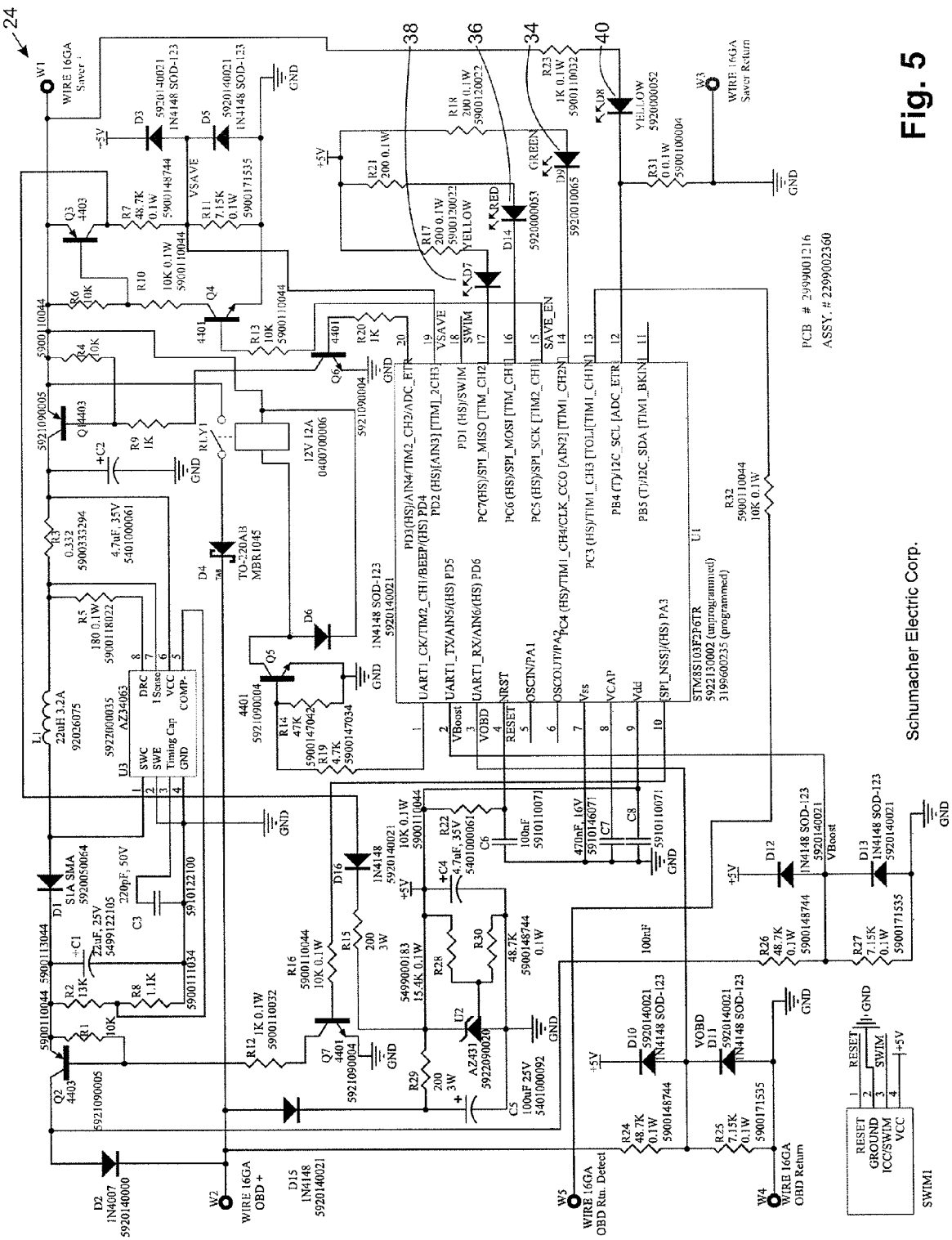
FIG. 5 is an electrical schematic diagram of an exemplary embodiment of the interconnect device in accordance with the present invention.

Referring to FIG. 1, the interconnect device in accordance with the present invention, generally identified with the reference numeral 20. Includes a housing 22 for housing a detection and LED illumination circuit 24 (FIG. 5), an OBD II port connector 26 (FIG. 1), a first cable 28 interconnecting the OBD II port connector 26 to the detection and LED illumination circuit 24 (FIG. 5). In one exemplary embodiment, the interconnect device 20 includes a cigarette lighter connector 30 connected to the detection and LED illumination circuit 24 (FIG. 5) by way of a second cable 32. In alternate embodiments, the cigarette lighter connector 30 is eliminated and the cable 32 is either hard wired to a portable power supply (not shown) or connected to a different type of connector, such as an alligator clip (not shown).

An exploded view of the housing 22 illustrating exemplary LEDs 34, 36, 38 and 40. The LEDs 34, 36, 38 and 40 illustrate an exemplary embodiment. Other visual indication devices, such as a display, or aural indication devices are considered to be within the broad scope of the invention. Each LED 34, 36, 38 and 40 provides the user with different information with respect to the issue of whether a diode is connected in series with the power pin of the OBD II port connector 26 which will prevent back feeding of power through the OBD II port connector 26.

Figure 2:
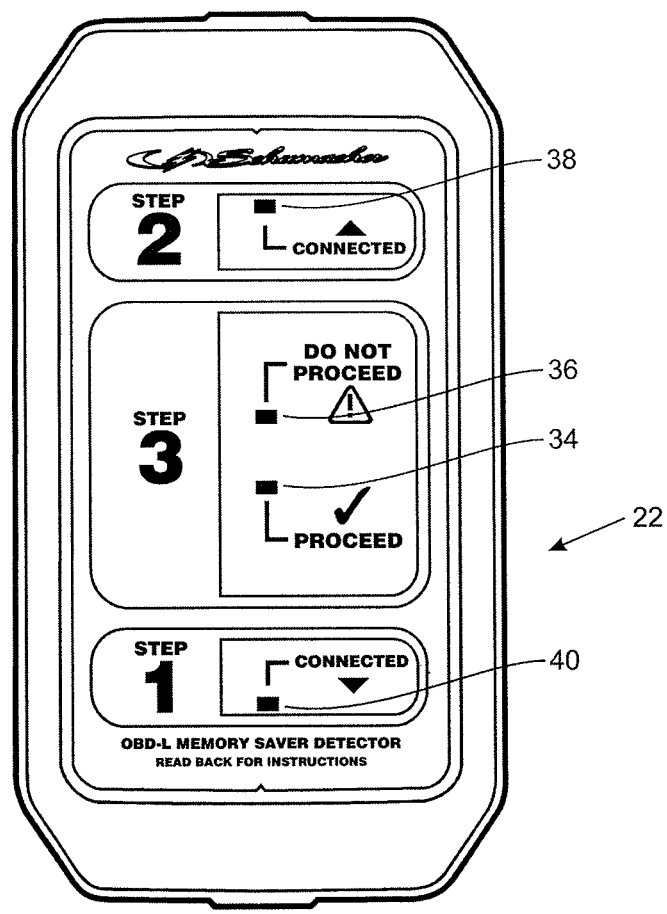
FIG. 2 is an enlarged view of the housing, illustrating an exemplary display.

In the exemplary embodiment illustrated in FIG. 2, a first LED 34, for example, a green LED is used to indicate that a diode is not connected to the OBD II port connector 26. When this LED 34 is illuminated, it indicates that the power can be back fed through the OBD II port connector 26 to preserve data. A second LED 36, for example, a red LED is used to indicate that a diode is connected to the power pin of the OBD II port connector 26. When the LED 36 is illuminated, power cannot be back fed through the OBD II connector 26. In this situation, an alternate power source is recommended to be connected to the battery cables, connected to the battery, before the battery cables are disconnected from the vehicle battery, In alternate embodiments of the invention, one or both of the LEDs 34, 36 may be provided without the LEDs 38 and 40.

The LEDs 38 and 40, for example yellow LEDs, are optional and indicate sound connections of the OBD II port connector 26 to the mating OBD II port connector (not shown) in the vehicle. The LED 40 may be used to indicate a connection between the cigarette lighter connector 30 and an alternate power supply from a different vehicle. In embodiments where the cable 32 is hard wired to a portable power supply (not shown), the LED 40 is omitted.

Figure 3:
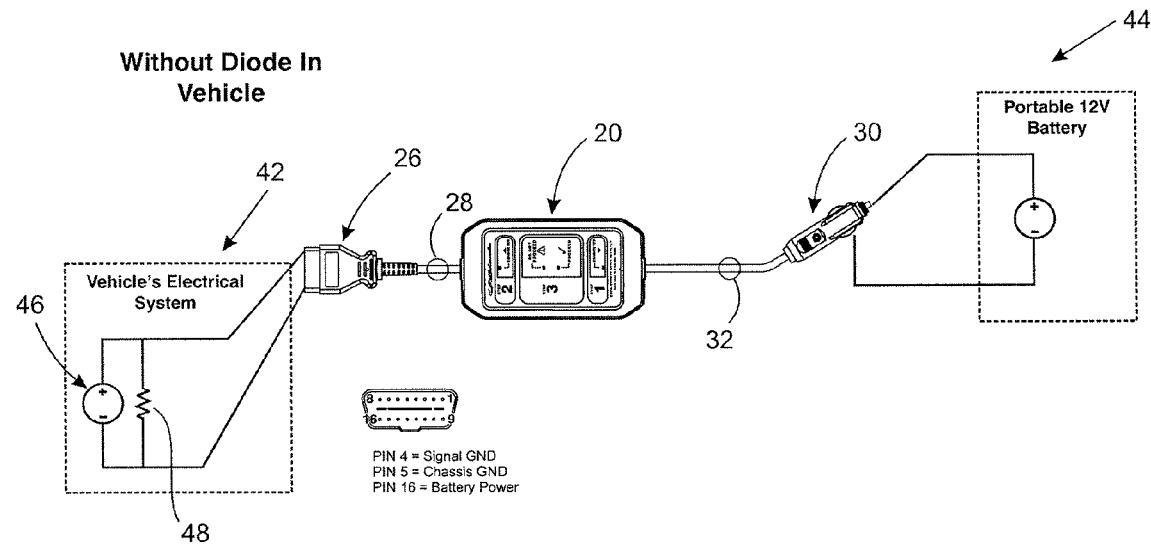
FIG. 3 is a diagram illustrating the interconnect device in accordance with the present invention connected to an OBD II port connector without a series diode and connected on the other end to an alternative power supply, for example, by way of a cigarette lighter connector.
Figure 4:
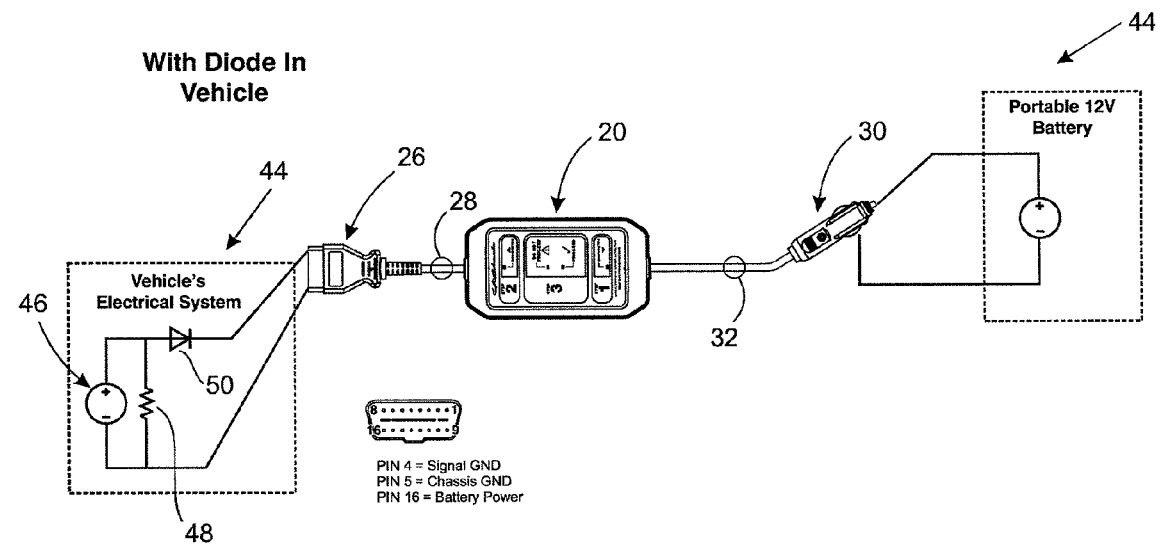
FIG. 4 is similar to FIG. 3, but shown connected to an OBD II port connector with a series diode.

FIGS. 3 and 4 illustrate applications of the interconnect device 20 in accordance with the present invention. FIG. 3 illustrates an application of the interconnect device 20 connected between a vehicle OBD II port connector 42 and an alternate power supply 44. In both applications, the OBD II port connector 26 is connected to three pins on the vehicle OBD II port connector. These pins are as follows:

PIN 4: Signal GND
PIN 5: Chassis GND
PIN 16: Battery Power

Both applications also represent the vehicle electrical system as a so-called Norton equivalent circuit; namely, a power source 46 and a parallel resistor 48. FIG. 3 illustrates a direct connection between the power pin 16 of the OBD II port connector 26 and the vehicle electrical system. In one embodiment of the invention, the yellow LED 38 (FIG. 2) will illuminate. In such an application, the interconnect device 20 will illuminate the green LED 34, indicating that the vehicle electrical system can be back fed through the vehicle OBD II port connector if the alternate power source 44 is connected. If so, the yellow LED 40 will illuminate. The vehicle power supply 46 can then be safely disconnected.

FIG. 4 illustrates an application where a blocking diode represents circuitry (or other means) 50 is connected in series with the power pin 16 of the vehicle OBD II port connector. In this situation, the blocking diode 50 prevents power from being back fed to the vehicle electrical system through the vehicle OBD II connector. In this situation, the red LED 36 (FIG. 2) will illuminate indicating that the vehicle OBD II port connector has a blocking diode serially connected to its power pin. The yellow LEDs 38 and 40 may also be lit. The blocking diode 50 prevents the vehicle electrical system from being back fed through the vehicle OBD II port connector. As mentioned above, in such a situation, an alternate power supply needs to be connected to the battery cables of the battery to be disconnected before disconnecting the vehicle battery.

An exemplary circuit 24 is illustrated in FIG. 5. As mentioned above, the circuit 24 is configured to do the following:

Verify the connection s between the OBD II port connector 26 connected to the interconnect device 20 and the vehicle OBD II port connector.

Measures the voltage of the alternate power source to be sure it is at or above required nominal input levels to serve as a temporary replacement for the vehicles battery before allowing connection through the OBD port.

Verify the connection between the cigarette lighter connector 30 connected to the interconnect device 20 and an alternate power supply.

Detect whether the vehicle OBD II port connector includes a blocking diode serially connected to its power pin.

Illuminate LEDs representative of the above.

At the heart of the detection circuit 24 is a microcontroller U1, for example a Model No. STM8S103F2P6TR from STMicroelectronics. The detection circuit 24 includes 5 external pin connections. The pins W1 and W3 are connected to the alternate power supply 44 (FIGS. 3 and 4) by way of the cable 32, either directly or by way of the cigarette lighter connector 30. The pins W2, W5 and W4 of the detection circuit 24 are connected to the OBD II port connector 26 by way of the cable 28. Specifically, the PIN W2 of the detection circuit 24 is connected to the battery power PIN 16. PIN W4 of the detection circuit 24 is connected to PIN 5 of the OBD II port connector 26, chassis ground. PIN W5 of the detection circuit 24 is connected to signal ground, PIN 4 of the OBD II port connector 26.

The LEDs 34, 36, 38 and 40 are connected to the microcontroller U1. Specifically, the yellow LED 40, which represents a connection to an alternate power supply 44 (FIGS. 3 and 4), is connected to the PIN W1 of the detection circuit 24 and to port PB4 (PIN 12) of the microcontroller U1 by way of a pair of voltage divider resistors R23 and R31. When a connection is made to the alternate power source 44, the yellow LED 40 is turned on by the microcontroller U1 if the voltage available at the alternate power source 44 is greater than a predetermined value, for example, >6 volts. The LEDs 34, 36 and 38 are connected between a 5 volt DC supply and ports PC4, PC6 and PC7 (PINS 14, 16 and 17) by way of current limiting resistors R18, R21 and R17 respectively. If the voltage at the OBD II port 26 sensed by the microcontroller U1 is >1.0 volts, a good connection will be indicated even if there is a diode connected to the power pin of the vehicle OBD II port connector since the vehicle electrical system voltage will appear at the cathode of the diode 50 if there is a good connection between the OBD II port connector 26 and the vehicle OBD II port connector.

As mentioned above, PIN W1 of the detection circuit 24 is connected to the alternate power supply 44. The voltage of the alternate power source is sensed by Port PD2 (PIN 19) of the microcontroller U1 by way of a transistor Q3 and a resistor R7. A resistor R11 and a pair of diodes D3 and D5 connected between a 5 volt supply and ground provide over and under voltage for the input to PIN 19. In order to avoid draining the alternate power source 44, the sensing of the alternate power source 44 is enabled when needed. More specifically, the transistor Q3 is under the control of a transistor Q4, which is driven by Port PC5 (PIN 15) of the microcontroller U1. The emitter of the transistor Q4 is connected to a top rail by way of a pair of resistors R6 and R10. The base of the transistor Q4 is connected to PIN 15 by way of a resistor R13. As such, the microcontroller U1 is able to control the switching of the transistor Q4, which in turn, controls the switching of the transistor Q3 in order to selectively turn off voltage sensing of the alternate power supply 44 to limit the battery drain.

The regulator U3, for example, a Model AZ30463 by BCD Semiconductor Ltd., together with the resistors R2, R3, R5 and R8, an inductor L1, a diode D1 and a pair of capacitors C1 and C2, form a switchable power supply and more specifically a boost converter for converting a 12 volt signal from the alternate power supply 44 and converting it to a 16 volt pulse.

The 16 volt pulse is applied to the vehicle electrical system 44 by way of a transistor Q2 and a diode D2. The transistor Q2 is under the control of a transistor Q7. A pair of resistors R1 and R12 is coupled between the transistors Q1 and Q7. The transistor Q7, in turn, is driven by Port PA3 (PIN10) of the microcontroller U1.

The PIN W2 is connected to the OBD II power pin and thus the vehicle electrical system. The voltage of the vehicle electrical system is read by Port PD6 (PIN 3) via a pair of resistors R26 and R27 and a pair of diodes D12 and D13 provide over and under voltage protection, as discussed above. A diode D2 prevents transistor Q2 from being exposed to excessive reverse biasing voltages. The voltage of the 16 volt pulse from the switchable power supply is measured by the microcontroller U1 at Port PD5 (PIN 2).

In order to test for the diode connected to the PWR pin of the vehicle OBD II port connector 26, a diode detection circuit is actuated. The diode detection circuit includes the switchable power supply and the detection of the voltage of the 16 volt pulse, generated by the switchable power supply and the voltage of the PWR pin of the OBD II port connector 26. The voltage of the pulse is measured, as discussed above. The voltage available at the PWR PIN of the OBD II port connector 26 is also measured, as discussed above. In order to determine if a blocking diode or equivalent is connected to the power pin of the vehicle OBD II port connector, transistor Q2 is activated by activating Q7, connecting the switchable power supply to the vehicle OBD II port connector 26. If the switchable power supply voltage falls below 15 Volts, then it is determined that current is flowing between the switchable power supply and the vehicle's electrical system, meaning that the vehicle's electrical system has no diode or similar electronics preventing power from being supplied by a device attached to the vehicle's OBD II port. If the switchable power supply voltage remains above 15 Volts, after a reasonable period of time, then it is determined that the vehicle's electrical system contains a blocking device, such as a diode, which prevents the vehicle's electrical system from sourcing power through the vehicle's OBD II port. After the determination, the diode detection circuit may be turned off by turning off the serial transistor Q3.

A relay RLY is used to connect the alternate power supply 44, connected to PIN W1 of the detection circuit 24 to the vehicle electrical system 50. PIN W2 of the detection circuit 24, under the conditions discussed below. The relay RLY is under the control of Port PR4 (PIN1) of the microcontroller U1. Specifically, the relay RLY is connected to PIN 1 of the microcontroller U1 by way of a transistor Q5, a diode D6 and a pair of resistors R14 and R19.

If the voltage of the alternate power source 44 is sufficient, for example >6 volts, and the OBD II port connector 26 is plugged into the vehicle OBD II port connector and the device has determined that the vehicle's electrical system is capable of sourcing power through the OBD II port as described above, the relay RLY is energized and a relay contact RLY 1 connects PIN W1 to W2 of the detection circuit 22, thereby connecting the alternate power source 44 to the vehicle electrical system 42. At this point the vehicle battery may be safely removed and replaced or reconnected. At a later time after which, the relay RLY is deactivated by simply disconnecting the cigarette lighter connector 32 from the other vehicle or disconnecting the OBD II port connector 26 from the vehicle OBD II connector.

The circuitry consisting of D15 and D16, the Zener diode U2, the resistors R15, R22, R28-R30 and the capacitors C6-C8 relate to the power supply and the reset for the microcontroller U1 and are connected to pins 7-10.

Figure 6:
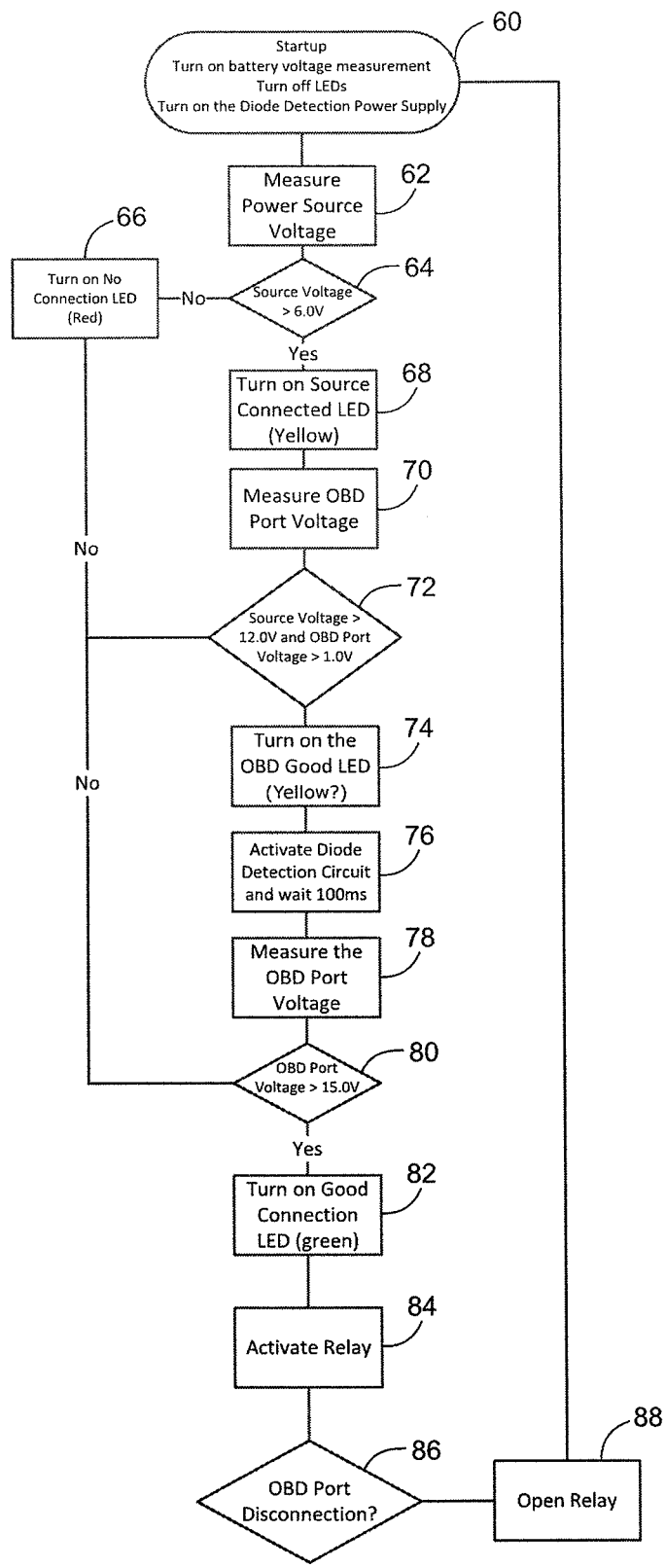
FIG. 6 is a software flow chart for the interconnect device in accordance with the present invention.

An exemplary software flow chart is illustrated in FIG. 6. Initially, the interconnection device 20 is connected on one end to an alternate power supply 44, either directly or by way of the cigarette lighter connector 32 and on the other end the OBD II port connector 26 is connected to the vehicle OBD II port connector 26. Once the device 20 is connected, all of the LEDs 34, 36, 38 and 40 are turned off. In step 60. In addition, voltage detection is commenced by the microcontroller U1 and the switched mode power supply is turned on by way of the transistor Q3. In step 62, the alternate power source 44 voltage is measured by way of PIN 12 of the microcontroller U1. The system then compares the voltage with a reference voltage, for example, 6 volts, to determine if the voltage of the alternate power source 44 is greater than the reference voltage in step 64. If not, the red LED D14 is illuminated in step 66 indicating no connection. If the voltage of the alternate voltage source is greater than the reference voltage, the yellow LED D6 is illuminated in step 68. Next in step 70, the system measures the voltage at the OBD II port connector 26 in step 70. If a voltage is measured, for example, a voltage >1 volt, a good connection is indicated between the OBD II port connector 26 and the vehicle and the OBD II port connector and the yellow LED D7 is illuminated. In step 72, the system checks that there is a good connection between the OBD II port connector 26 and the vehicle OBD II port connector and whether the alternate source 44 voltage is > than a reference value. If so, the yellow LED D7 is illuminated in step 74, indicating that the interconnection device 20 has been successfully connected between the alternate power source 44 and the vehicle OBD II port connector.

Next, in step 76, the diode detection circuit is activated. After a predetermined wait period, the transistor Q2 is turned on so that the voltage across the diode D2 can be read by the microcontroller U1 to determine if current is flowing through the diode D2.

In step 78, the voltage at the power pin of the OBD II port connector 26 is measured. As mentioned above, the switched mode power supply generates a 16 volt pulse. That 16 volt pulse is dropped across the capacitor C1. If the vehicle OBD II port connector has a blocking diode or equivalent the diode D2 will not conduct and will therefore be off. With the diode D2 off, the OBD II port voltage read by PIN 2 of the microcontroller U1 will be the vehicle electrical system voltage of 12 volts. If the vehicle OBD II port connector does not contain a blocking diode, the diode D2 will conduct. With the diode D2 conducting, 16 volts minus the drop across the diode will be sensed by the microcontroller U1. Thus, in step 80, the system checks whether the OBD port voltage is >15 volts. If so, the system assumes that the vehicle OBD II port connector does not have a blocking diode or equivalent. If the vehicle OBD II port connector does not contain a blocking diode and a good connection between the vehicle OBD II port connector and the OBD II port connector 26 and the voltage of the alternate power supply 44 is greater than a predetermined value, the green LED D9 is turned on in step 82 and the relay RLY is activated in step 84 connecting the alternate power supply to the vehicle OBD II port connector and thus the vehicle electrical system. The green LED D9 indicates that it is safe to disconnect the vehicle battery since the alternate power supply will maintain all of the vehicle data in the vehicle OBD system. The relay RLY will remain energized until the OBD II connector 26 is disconnected from the vehicle OBD II connector.

Obviously, many modifications and variations of the present invention are possible in light of the above teachings. Thus, it is to be understood that, within the scope of the appended claims, the invention may be practiced otherwise than as specifically described above.

We claim:

1. An interconnect device for detecting whether a vehicle electrical system includes a blocking diode or equivalent, the interconnect device comprising:
    an OBD II connector for connecting said interconnect device to said vehicle electrical via a vehicle on-board diagnostics (OBD) II port connector;
    an alternate power supply connected to said OBD II connector;
    a detection circuit, connected to said OBD II connector, for detecting whether the vehicle electrical system includes a blocking diode configured to prevent back feeding of power through the vehicle OBD II port connector;
    an indicating device; and
    circuitry including a relay for connecting said alternate power supply to said vehicle electrical system if (1) said detection circuit detects that the vehicle electrical system does not contain a blocking diode and (2) the OBD II connector is connected to the vehicle OBD II port connector.

2. The interconnect device as recited in claim 1, further including a circuit for determining whether said OBD II connector is connected to said vehicle OBD II port connector.

3. The interconnect device as recited in claim 1, wherein said indicating device is a visual indicating device.

4. The interconnect device as recited in claim 3, wherein said visual indicating device is an LED.

5. The interconnect device as recited in claim 3, wherein said visual indicating device is a display.

6. The interconnect device as recited in claim 1, wherein said indicating device is an aural indicating device.

7. The interconnect device as recited in claim 2, wherein said circuit determines whether said OBD II connector is connected to said vehicle OBD II port connector based on a voltage measured at said OBD II connector after the OBD II connector connected to said vehicle OBD II port connector.

8. The interconnect device as recited in claim 7, wherein said connection between said OBD II connector and said vehicle OBD II port connector is assumed if the voltage measured at the OBD II connector is greater than 1.0 volts DC.

9. The interconnect device as recited in claim 1, wherein said circuitry is configured to prevent said relay from connecting said alternate power supply to said vehicle electrical system unless a voltage at said alternate power supply is greater than a predetermined value.

10. The interconnect device as recited in claim 9, wherein said predetermined value is 6.0 volts DC.

11. The interconnect device as recited in claim 9, further including a second indicating device for indicating whether said voltage at said power supply is greater than said predetermined value.

12. An interconnect device for detecting whether a vehicle electrical system includes a blocking diode or equivalent, the interconnect device comprising:
    an OBD II connector for connecting said interconnect device to said vehicle electrical system via a vehicle on-board diagnostics (OBD) II port connector;
    a connector configured to couple with an alternate power supply and a detection circuit, wherein the detection circuit detects whether the vehicle electrical system includes a blocking diode configured to prevent back feeding of power through the vehicle OBD II port connector;
    an indicating device; and
    circuitry including a relay for connecting said alternate power supply via said connector to said vehicle electrical system if (1) said detection circuit detects that the vehicle electrical system does not contain a blocking diode and (2) the OBD II connector is connected to the vehicle OBD II port connector.

13. The interconnect device as recited in claim 12, further including a circuit for checking the connection of said OBD II connector to said vehicle OBD II port connector.

14. The interconnect device as recited in claim 12, wherein said indicating device is a visual indicating device.

15. The interconnect device as recited in claim 14, wherein said visual indicating device is an LED.

16. The interconnect device as recited in claim 14, wherein said visual indicating device is a display.

17. The interconnect device as recited in claim 12, wherein said indicating device is an aural indicating device.

18. The interconnect device as recited in claim 12, wherein said circuit for checking the connection between said OBD II connector to said vehicle OBD II port connector is based on the voltage measured at said OBD II connector after it is connected to said vehicle OBD II port connector.

19. The interconnect device as recited in claim 12, wherein said connection between said OBD II connector to said vehicle OBD II port connector is assumed if the voltage measured at the OBD II connector is greater than 1.0 volts DC.

20. The interconnect device as recited in claim 12, wherein said circuitry is configured to prevent said relay from connecting said alternate power supply to said vehicle electrical system unless a voltage at said connector connected to said alternate power supply is greater than a predetermined value.

21. The interconnect device as recited in claim 20, wherein said predetermined value is 6.0 volts DC.

22. The interconnect device as recited in claim 20, further including an indicating device for indicating whether said voltage at said connector, when connected to said power supply, is greater than said predetermined value.

23. The interconnect device as recited in claim 12, wherein said connector is a cigarette lighter connector.

24. A method for disconnecting a vehicle battery, the method comprising the steps:
(a) determining, via a detection circuit, whether a vehicle electrical system includes a blocking diode that prevents back feeding of power through a vehicle on-board diagnostics (OBD) II port connector;
(b) connecting an alternate power supply to said vehicle electrical system via the vehicle OBD II port connector if said detection circuit detects that the vehicle electrical system does not contain a blocking diode
(c) indicating, via an indicating device, that the vehicle battery is disconnected from the vehicle electrical system when said alternate power supply is connected to said vehicle electrical system.

* * * * *